(12) United States Patent
Harayama et al.

(10) Patent No.: US 10,535,545 B2
(45) Date of Patent: Jan. 14, 2020

(54) SUBSTRATE FIXING DEVICE

(71) Applicant: SHINKO ELECTRIC INDUSTRIES CO., LTD., Nagano (JP)

(72) Inventors: Yoichi Harayama, Nagano (JP); Yoji Asahi, Nagano (JP); Keiichi Takemoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 237 days.

(21) Appl. No.: 15/659,773

(22) Filed: Jul. 26, 2017

(65) Prior Publication Data

US 2018/0040497 A1    Feb. 8, 2018

(30) Foreign Application Priority Data

Aug. 8, 2016 (JP) .................................. 2016-155760

(51) Int. Cl.
| | |
|---|---|
| *H01L 21/683* | (2006.01) |
| *H01L 21/67* | (2006.01) |
| *H02N 13/00* | (2006.01) |
| *H01L 21/687* | (2006.01) |
| *H05B 3/00* | (2006.01) |

(52) U.S. Cl.
CPC .... *H01L 21/6833* (2013.01); *H01L 21/67103* (2013.01); *H01L 21/6831* (2013.01); *H02N 13/00* (2013.01); *H01L 21/67109* (2013.01); *H01L 21/68714* (2013.01); *H05B 3/00* (2013.01)

(58) Field of Classification Search
USPC ......................................................... 361/234
See application file for complete search history.

(56) References Cited

U.S. PATENT DOCUMENTS

| | | | |
|---|---|---|---|
| 9,343,346 B2 | 5/2016 | Kosakai et al. | |
| 2003/0038129 A1* | 2/2003 | Hiramatsu | ........ H01L 21/67103 219/444.1 |
| 2011/0062144 A1* | 3/2011 | Akatsuka | ............... H05B 3/143 219/532 |
| 2014/0301010 A1* | 10/2014 | Hayahara | .......... H01L 21/67109 361/234 |

FOREIGN PATENT DOCUMENTS

| | | |
|---|---|---|
| JP | 2000-150119 | 5/2000 |
| JP | 2001-313154 | 11/2001 |
| JP | 2003-100422 | 4/2003 |
| JP | 2011-176275 | 9/2011 |
| JP | 2015-197971 | 11/2015 |

OTHER PUBLICATIONS

Japanese Office Action dated Oct. 29, 2019 issued with respect to the basic Japanese Patent Application No. 2016-155760 with full machine translation.

* cited by examiner

*Primary Examiner* — Danny Nguyen
(74) *Attorney, Agent, or Firm* — IPUSA, PLLC

(57) ABSTRACT

A substrate fixing device includes a baseplate, an electrostatic chuck, and an insulating layer interposed between the baseplate and the electrostatic chuck. The insulating layer includes a heating element formed of a first material and a wiring line connected in series to the heating element. The wiring line includes a first conductive layer formed of the first material and a second conductive layer joined onto the first conductive layer. The second conductive layer is formed of a second material having a resistivity lower than the resistivity of the first material.

7 Claims, 10 Drawing Sheets

SUBSTRATE FIXING DEVICE

CROSS-REFERENCE TO RELATED APPLICATION

This application is based upon and claims the benefit of priority of the prior Japanese Patent Application No. 2016-155760, filed on Aug. 8, 2016, the entire contents of which are incorporated herein by reference.

FIELD

A certain aspect of the embodiments discussed herein is related to substrate fixing devices.

BACKGROUND

Conventional film deposition apparatuses (such as CVD apparatuses and PVD apparatuses) and plasma etching apparatuses used for manufacturing semiconductor devices such as ICs and LSIs include a stage for accurately holding a wafer in a vacuum process chamber. As such a stage, for example, a substrate fixing device that attracts and holds a wafer, which is an object to be attracted and held, using an electrostatic chuck mounted on a baseplate, has been proposed.

Some substrate fixing devices are provided with a heating element (heater element) for controlling wafer temperature. The heating element, for example, is joined to a surface of the electrostatic chuck using an adhesive, and generates heats when supplied with voltage from a power supply disposed outside the substrate fixing device through power feed terminals. (See, for example, Japanese Laid-open Patent Publication No. 2011-176275.)

SUMMARY

According to an aspect of the invention, a substrate fixing device includes a baseplate, an electrostatic chuck, and an insulating layer interposed between the baseplate and the electrostatic chuck. The insulating layer includes a heating element formed of a first material and a wiring line connected in series to the heating element. The wiring line includes a first conductive layer formed of the first material and a second conductive layer joined onto the first conductive layer. The second conductive layer is formed of a second material having a resistivity lower than the resistivity of the first material.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
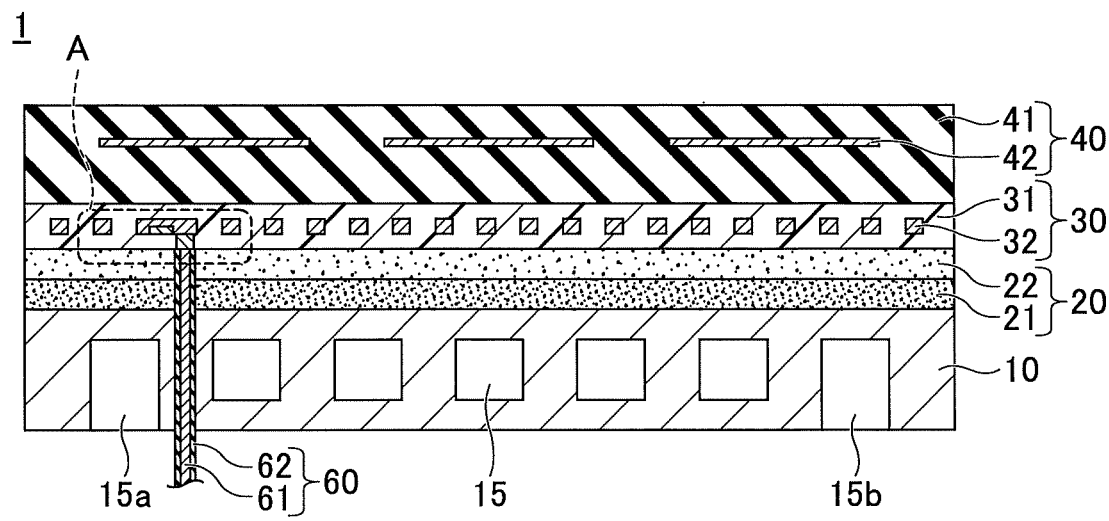
FIGS. 1A and 1B are schematic cross-sectional views of a substrate fixing device according to a first embodiment.

As noted above, some substrate fixing devices are provided with a heating element. A material whose resistivity is somewhat high is used for a heating element. Therefore, for example, when wiring lines are provided to extend from the heating element to power feed terminals, the wiring lines formed of the same material as the heating element may generate unintended heat to impair the uniformity of the heat generated by the heating element.

According to an aspect of the present invention, a substrate fixing device with improved uniformity of heat generated by a heating element is provided.

Preferred embodiments of the present invention will be explained with reference to accompanying drawings. In the drawings, the same elements or components are referred to using the same reference numeral, and a repetitive description thereof may be omitted.

[a] First Embodiment

[Structure of Substrate Fixing Device]

Figure 1B:
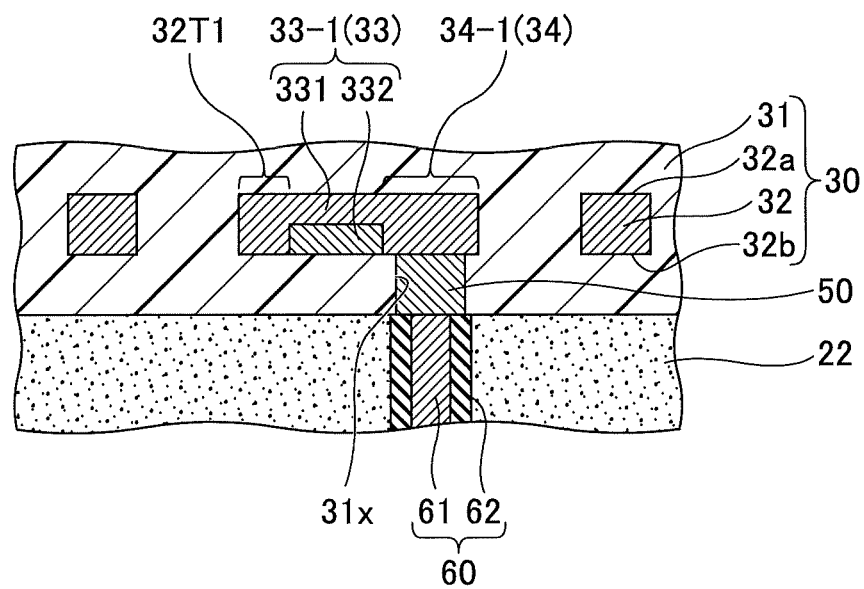

FIG. 1A is a schematic cross-sectional view of a substrate fixing device in its entirety according to a first embodiment. FIG. 1B is a schematic enlarged view of part A of FIG. 1A. Referring to FIGS. 1A and 1B, a substrate fixing device 1 includes a baseplate 10, an adhesive layer 20, a heating part 30, and an electrostatic chuck 40.

The baseplate 10 is a member for mounting the heating part 30 and the electrostatic chuck 40. The thickness of the baseplate 10 may be, for example, approximately 20 mm to approximately 50 mm. The baseplate 10 is formed of, for example, aluminum, and may also be used as, for example, an electrode for controlling plasma. By feeding the baseplate 10 with predetermined high-frequency electric power, it is possible to control energy for causing, for example, generated ions in the state of plasma to collide with a wafer attracted onto the electrostatic chuck 40 to effectively perform etching.

A water conduit 15 is provided in the baseplate 10. The water conduit 15 includes a cooling water introduction part 15a at one end and a cooling water discharge part 15b at the other end. The water conduit 15 is connected to a cooling water controller (not depicted) provided outside the substrate fixing device 1. The cooling water controller introduces cooling water into the water conduit 15 from the cooling water introduction part 15a and discharges the cooling water from the cooling water discharge part 15b. By cooling the baseplate 10 by circulating cooling water through the water conduit 15, it is possible to cool a wafer attracted onto the electrostatic chuck 40. In addition to the water conduit 15, for example, a gas conduit for introducing an inert gas for cooling a wafer attracted onto the electrostatic chuck 40 may be provided in the baseplate 10.

The heating part 30 is firmly adhered onto the baseplate 10 through the adhesive layer 20. The adhesive layer 20 may have, for example, a two-layer structure of a first layer 21 and a second layer 22. For example, a silicone adhesive may be used as the first layer 21 and the second layer 22. The thickness of each of the first layer 21 and the second layer 22 may be, for example, approximately 1 mm. The thermal conductivity of the first layer 21 and the second layer 22 is preferably 2 W/mK or higher. The adhesive layer 20 may be formed of a single layer. By combining an adhesive having a high thermal conductivity and an adhesive having a low elastic modulus to form a two-layer structure, however, it is possible to achieve a stress reduction effect to reduce stress generated from a difference in thermal expansion between the aluminum baseplate 10 and the electrostatic chuck 40.

The heating part 30 includes an insulating layer 31, a heating element 32, wiring lines 33, and power feed terminals 34.

The insulating layer 31 surrounds and covers the heating element 32, the wiring lines 33, and the power feed terminals 34. The insulating layer 31 is interposed between the baseplate 10 and the electrostatic chuck 40. Suitable materials for the insulating layer 31 include, for example, an epoxy resin and a bismaleimide-triazine resin having a high thermal conductivity and high heat resistance. The thermal conductivity of the insulating layer 31 is preferably 3 W/mK or higher. By including a filler such as alumina or aluminum nitride in the insulating layer 31, it is possible to improve the thermal conductivity of the insulating layer 31. The glass-transition temperature (Tg) of the insulating layer 31 is preferably 250° C. or higher. The thickness of the insulating layer 31 is preferably approximately 100 μm to approximately 150 μm. The thickness variation of the insulating layer 31 is preferably ±10% or less.

As the heating element 32, a rolled alloy is preferably used. By using a rolled alloy as the heating element 32, it is possible to reduce variations in the thickness of the heating element 32 to improve the distribution of generated heat. The heating element 32 does not necessary have to be buried in the center of the insulating layer 31 in its thickness direction. The heating element 32 may be offset from the center of the insulating layer 31 in its thickness direction toward the baseplate 10 or the electrostatic chuck 40 in accordance with required specifications.

The resistivity of the heating element 32 is preferably 10 μΩ/cm to 70 μΩ/cm, and more preferably, 10 μΩ/cm to 50 μΩ/cm. Conventional substrate fixing devices employ a NiCr heating element whose resistivity is approximately 100 μΩ/cm. Therefore, in the case of designing a 20Ω to 50Ω heating element, the heating element becomes approximately 1 mm to approximately 2 mm in width and approximately 50 pin in thickness, thus making it difficult to form a fine pattern of the heating element. By causing the resistivity of the heating element 32 to be 10 μΩ/cm to 70 μΩ/cm, which is lower than the resistivity of the NiCr heating element, the pattern of the heating element 32 can be finer than conventionally in the case of designing the same 20Ω to 50Ω heating element. When the resistivity of the heating element 32 is less than 10 μΩ/cm, the generation of heat by the heating element 32 becomes insufficient. Accordingly, a resistivity of less than 10 μΩ/cm is not preferable.

Suitable materials of rolled alloys for the heating element 32 include, for example, CN49 (constantan) (a Cu—Ni—Mn—Fe alloy), zeranin (a Cu—Mn—Sn alloy), and manganin (a Cu—Mn—Ni alloy). The resistivity of CN49 (constantan) is approximately 50 μΩ/cm. The resistivity of zeranin is approximately 29 μΩ/cm. The resistivity of manganin is approximately 44 μΩ/cm. The thickness of the heating element 32 is preferably 60 μm or less in view of the formability of a pattern by etching.

In order to improve the adhesion between the heating element 32 and the insulating layer 31 at high temperatures, at least one surface of the heating element 32, namely, one or both of an upper surface 32a and a lower surface 32b of the heating element 32, are preferably roughened. In the case of roughening both the upper and lower surfaces 32a and 32b of the heating element 32, the roughening method may differ between the upper surface 32a and the lower surface 32b. The roughening method may be, but is not limited in particular to, for example, etching, surface modification using a coupling agent, or dot processing using a UV-YAG laser at a wavelength of 355 nm or less.

Figure 2A:
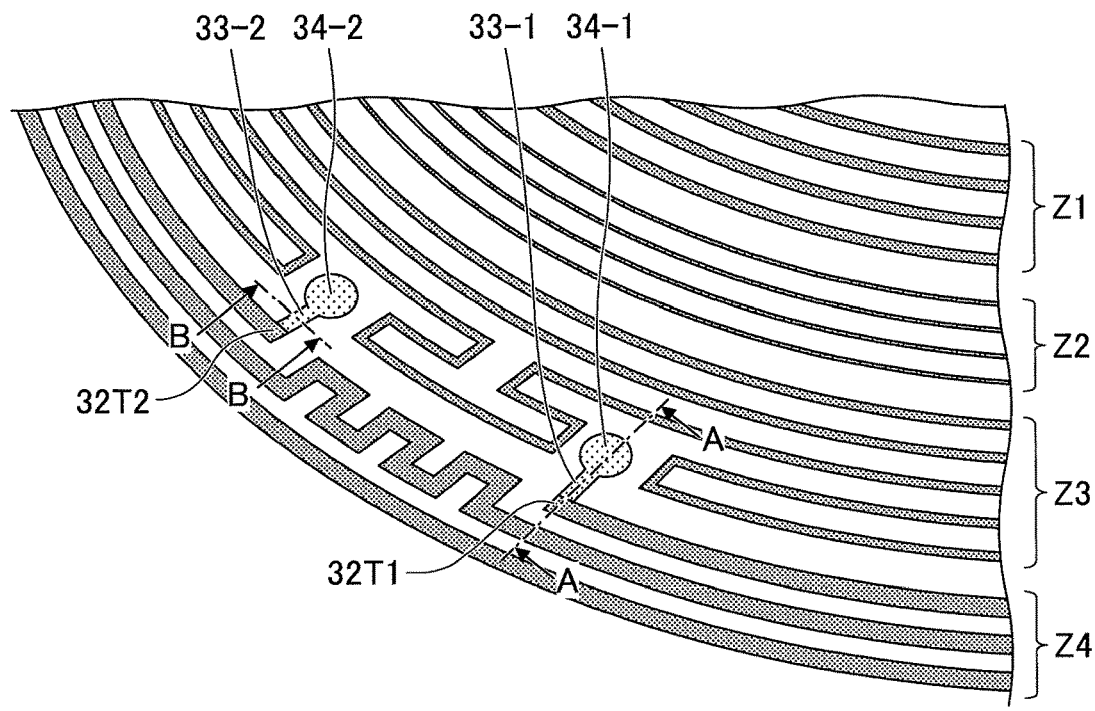
FIGS. 2A through 2C are diagrams illustrating a heating element of the substrate fixing device according to the first embodiment.
Figure 2B:
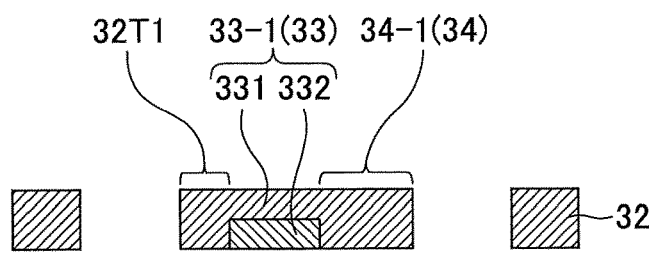
Figure 2C:
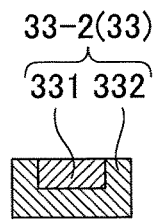

FIGS. 2A through 2C are diagrams illustrating a heating element of a substrate fixing device according to the first embodiment. FIG. 2A is a partial plan view, FIG. 2B is a cross-sectional view, taken along the line A-A of FIG. 2A, and FIG. 2C is a cross-sectional view, taken along the line B-B of FIG. 2A. Referring to FIGS. 1A through 2C, the heating element 32 includes multiple heating elements that are independently provided one in each of four zones Z1 through Z4, namely, the inner zone Z1, the mid-inner zone Z2, the mid-outer zone Z3, and the outer zone Z4, which are arranged in this order from the center to the periphery of the substrate fixing device 1. This zone arrangement, however, is an example, and the number of zones is not limited to four. Hereinafter, the individual heating elements of the four zones Z1 through Z4 may also be referred to using reference numeral "32."

The heating element 32 in each of the zones Z1 through Z4 is a substantially concentric continuous pattern, and is provided with a pair of power feed terminals 34. By independently supplying voltage to the pair of power feed terminals 34 of each of the zones Z1 through Z4, it is possible to control the temperatures of the zones Z1 through Z4 independent of one another. The width and interval of the heating element 32 are determined independently in each of the zones Z1 through Z4 in accordance with required specifications.

Here, the power feed terminals 34 are described in more detail, taking the zone Z4 as an example. Although not depicted, each of the other zones Z1 through Z3 is provided with the power feed terminals 34 the same as the zone Z4.

A wiring line 33-1 serving as a lead line is connected in series to a first end 32T1 of the heating element 32 placed in the zone Z4. Furthermore, a power feed terminal 34-1 to supply voltage to the heating element 32 is connected in series to the wiring line 33-1. Likewise, a wiring line 33-2 serving as a lead line is connected in series to a second end 32T2 of the heating element 32 placed in the zone Z4. Furthermore, a power feed terminal 34-2 is connected in series to the wiring line 33-2. The wiring lines 33-1 and 33-2 are examples of the wiring lines 33, and the power feed terminals 34-1 and 34-2 are examples of the power feed terminals 34. The planar shape of each of the power feed terminals 34 is, for example, a circle. Each of the power feed terminals 34 is connected to one end of a conductor 61 (such as a copper wire) of one of power feed lines 60 through a joining part 50 (such as solder) provided in one of openings 31x of the insulating layer 31. The conductor 61 is surrounded and covered by an insulator 62 (such as vinyl). The other end of the conductor 61 of each power feed line 60 is connected to a power supply external to the substrate fixing device 1.

The heating element 32 is a continuous pattern between the first end 32T1 and the second end 32T2. Therefore, when a predetermined voltage is applied between a pair of power feed terminals 34 from the external power supply via the power feed line 60 and the joining part 50, an electric current flows through the heating element 32 so that the heating element 32 generates heat. The amount of heat generated by the heating element 32 can be controlled by the voltage applied between the pair of power feed terminals 34.

When the placement density of the heating element 32 increases, it becomes difficult to place the pair of power feed terminals 34. For example, when the zone Z4 is narrower than another zone (for example, the zone Z3), it may be convenient to place the pair of power feed terminals 34 in the zone Z3. Furthermore, when the heating element 32 in the zone Z4 is wider and placed with a smaller interval than the heating element 32 in another zone (for example, the zone Z3), it may be convenient to place the pair of power feed terminals 34 in the zone Z3. In the case of FIG. 2A through 2C, the power feed terminals 34-1 and 34-2 for the heating element 32 in the zone Z4 are disposed in the zone Z3. In this case, the wiring lines 33-1 and 33-2 are disposed across, namely, extend from one to the other of, the adjacent zones Z3 and Z4. The specifications (such as width and interval) of the heating element 32, however, differ between zones. Therefore, for example, when the wiring lines 33-1 and 33-2 are designed based on the specifications of the zone Z4, the heating uniformity of the zone Z3 is impaired. Alternatively, when the wiring lines 33-1 and 33-2 are designed based on the specifications of the zone Z3, the heating uniformity of the zone Z4 is impaired.

Therefore, it is preferable to cause the wiring lines 33 extending across zones not to serve as a heating element. Therefore, according to this embodiment, the wiring lines 33 have a structure where a low resistance part 332 is joined onto a high resistance part 331. This structure makes it possible to reduce the resistance value of the wiring lines 33 to significantly reduce the heat generated by the wiring lines 33 compared with the heat generated by the heating element 32. Here, the high resistance part 331 is a first (electrically) conductive layer formed of the same material as the heating element 32, and the low resistance part 332 is a second (electrically) conductive layer formed of a material, such as a metal, having a lower resistivity than the material of the heating element 32. According to this embodiment, the high resistance part 331 is smaller in layer thickness than the heating element 32.

For example, when the heating element 32 is formed of CN49, the high resistance part 331 as well is formed of CN49. In this case, the low resistance part 332 may be formed of, for example, copper, which is lower in resistivity than CN49. The resistivity of copper is approximately, 1.7 µΩ/cm, which is approximately one-thirtieth (⅟₃₀) of the resistivity of CN49 (approximately 50 µΩ/cm). Therefore, by providing the low resistance part 332 in part of each wiring line 33, it is possible to significantly reduce the resistance value of the wiring lines 33.

The power feed terminals 34 may be formed of the same material as the heating element 32. Alternatively, the individual power feed terminals 34 may be formed partly of a material having a lower resistivity than the heating element 32. This is because the heat generated by the power feed terminals 34 is dissipated via the joining part 50 and the power feed lines 60 and the magnitude of the resistivity of the material of the power feed terminals 34 is therefore less likely to become a factor to impair the heating uniformity of each zone.

Referring back to FIGS. 1A and 1B, the electrostatic chuck 40 attracts and holds a wafer that is an object to be attracted and held. The wafer may be, for example, approximately 8 in., approximately 12 in., or approximately 18 in. in diameter.

The electrostatic chuck 40 is provided on the heating part 30. The electrostatic chuck 40 includes a substrate 41 and an electrostatic electrode 42. The electrostatic chuck 40 is, for example, a Johnsen-Rahbek electrostatic chuck. Alternatively, the electrostatic chuck 40 may be a Coulombic electrostatic chuck.

The substrate 41 is a dielectric. Suitable materials for the substrate 41 include, for example, ceramics such as aluminum oxide ($Al_2O_3$) and aluminum nitride (AlN). The thickness of the substrate 41 may be, for example, approximately 1 mm to approximately 10 mm. The relative permittivity (at 1 kHz) of the substrate 41 may be, for example, approximately 9 to approximately 10. The electrostatic chuck 40 and the insulating layer 31 of the heating part 30 are directly bonded. By directly bonding the heating part 30 and the electrostatic chuck 40 without interposing an adhesive between the heating part 30 and the electrostatic chuck 40, it is possible to increase the heatproof temperature of the substrate fixing device 1. The heatproof temperature of conventional substrate fixing devices in which a heating part and an electrostatic chuck are bonded using an adhesive is approximately 150° C., while the heatproof temperature of the substrate fixing device 1 can be approximately 200° C.

The electrostatic electrode 42 is a thin-film electrode buried in the substrate 41. The electrostatic electrode 42 is connected to a power supply disposed outside the substrate fixing device 1. When a predetermined voltage is applied to the electrostatic electrode 42, an electrostatic attraction force is generated between the electrostatic electrode 42 and a wafer. As a result, the wafer can be attracted and held onto the electrostatic chuck 40. The attraction and holding force increases as the voltage applied to the electrostatic electrode 42 increases. The electrostatic electrode 42 may have either a monopolar shape or a bipolar shape. Suitable materials for the electrostatic electrode 42 include, for example, tungsten and molybdenum.

[Method of Manufacturing Substrate Fixing Device]

FIGS. 3A through 3L are diagrams illustrating a process of manufacturing a substrate fixing device according to the first embodiment. A description is given, with reference to FIGS. 3A through 3L, of a process of manufacturing the substrate fixing device 1, focusing on a process of forming the heating part 30. Here, a process of forming the heating part 30 of the zone Z4 is basically described, while a heating element and power feed terminals may be formed in other zones in the same manner as in the zone Z4. Compared with FIGS. 1A through 2C, FIGS. 3A through 3L are inverted in orientation.

Figure 3A:
FIGS. 3A through 3L are diagrams illustrating a process of manufacturing a substrate fixing device according to the first embodiment.

First, in the process depicted in FIG. 3A, the electrostatic chuck 40 including the substrate 41 and the electrostatic electrode 42 buried in the substrate 41 is formed by a known manufacturing method that includes the process of forming a via in a green sheet, the process of filling the via with conductive paste, the process of forming a pattern to become an electrostatic electrode, the process of stacking another green sheet on the green sheet and performing firing, and the process of performing surface planarization. In order to increase adhesion to an insulating resin film 311, a surface of the electrostatic chuck 40 to be laminated with the insulating resin film 311 may be subjected to, for example, blasting to be roughened.

Figure 3B:
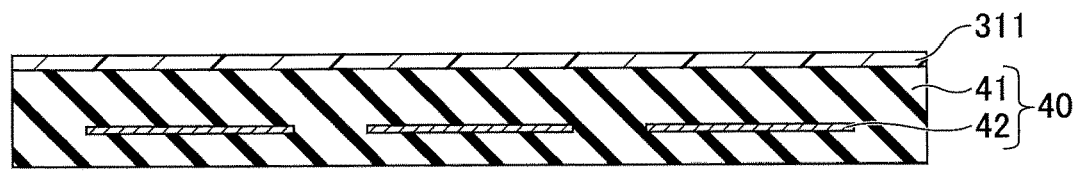

Next, in the process depicted in FIG. 3B, the electrostatic chuck 40 is directly laminated with the insulating resin film 311. Laminating the electrostatic chuck 40 with the insulating resin film 311 in a vacuum, which makes it possible to prevent inclusion of voids, is preferable. The insulating resin film 311 is left semi-cured (in B-stage) without being completely cured. Because of the adhesive force of the semi-cured insulating resin film 311, the insulating resin film 311 is temporarily fixed onto the electrostatic chuck 40.

Suitable materials for the insulating resin film 311 include, for example, an epoxy resin and a bismaleimide-triazine resin having a high thermal conductivity and high heat resistance. The thermal conductivity of the insulating resin film 311 is preferably 3 W/mK or higher. By including a filler such as alumina or aluminum nitride in the insulating resin film 311, it is possible to improve the thermal conductivity of the insulating resin film 311. The glass-transition temperature of the insulating resin film 311 is preferably 250° C. or higher. In teens of increasing heat transfer performance (the rate of heat transfer), the thickness of the insulating resin film 311 is preferably approximately 60 μm or less, and the thickness variation of the insulating resin film 311 is preferably ±10% or less.

Figure 3C:
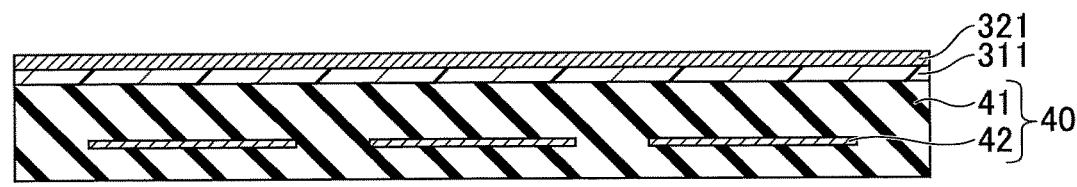

Next, in the process depicted in FIG. 3C, metal foil 321 is placed on the insulating resin film 311. Suitable materials for the metal foil 321 include the materials illustrated by way of example as materials for the heating element 32. In view of the formability of a pattern by etching, the thickness of the metal foil 321 is preferably 60 μm or less. Because of the adhesive force of the semi-cured insulating resin film 311, the metal foil 321 is temporarily fixed onto the insulating resin film 311.

Before placement of the metal foil 321 on the insulating resin film 311, it is preferable to roughen at least one surface (one or both of the upper and the lower surface) of the metal foil 321. In the case of roughening both the upper and the lower surface of the metal foil 321, the roughening method may differ between the upper and the lower surface. The roughening method may be, but is not limited in particular to, for example, etching, surface modification using a coupling agent, or dot processing using a UV-YAG laser at a wavelength of 355 nm or less.

According to dot processing, it is possible to selectively roughen a region of the metal foil 321 that requires roughening. Therefore, in the case of using dot processing, there is no need to roughen the entire region of the metal foil 321, and it is sufficient to roughen at least a region of the metal foil 321 to be left as the heating element 32 (that is, there is no need to go so far as to roughen a region of the metal foil 321 to be removed by etching).

Figure 3D:
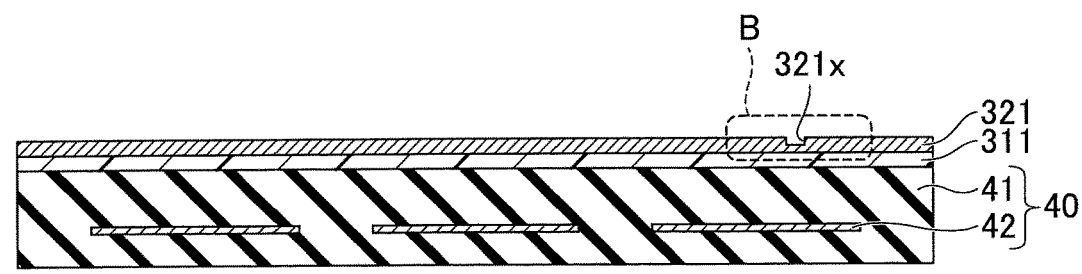
Figure 3E:
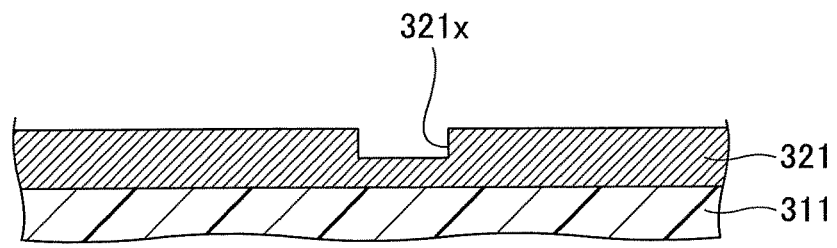
Figure 3F:
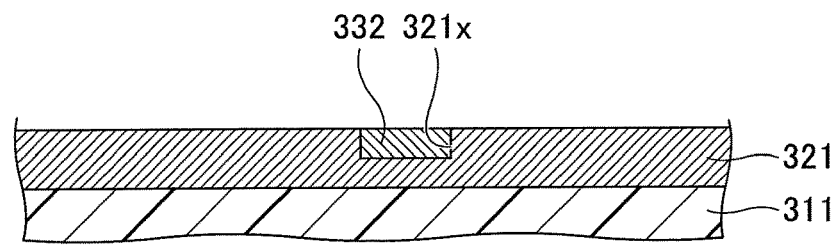
Figure 3G:
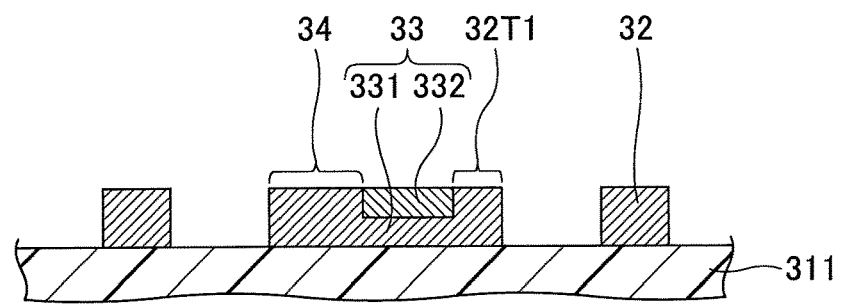

Next, in the process depicted in FIGS. 3D and 3E, the metal foil 321 is half-etched to form a recess 321x where the low resistance part 332 is desired to be famed. That is, the metal foil 321 is half-etched to form a part to become the high resistance part 331 that is smaller in layer thickness than the heating element 32. FIGS. 3E through 3G are enlarged views of part B of FIG. 3D.

Specifically, for example, a resist is formed on the entire surface of the metal foil 321, and is exposed to light and developed to form a resist pattern that exposes only a part of the metal foil 321 where the recess 321x is to be formed. Next, the metal foil 321 exposed through the resist pattern is half-etched to form the recess 321x. Thereafter, the resist is removed. As an etchant used to half-etch the metal foil 321, for example, a copper chloride etchant or a ferric chloride etchant may be used.

Next, in the process depicted in FIG. 3F, the low resistance part 332 is formed in the recess 321x. Specifically, for example, a resist is formed on the entire surface of the metal foil 321, and is exposed to light and developed to form a resist pattern that exposes only the recess 321x. Next, for example, copper is deposited in the recess 321x exposed through the resist pattern by, for example, electroplating, using the metal foil 321 as a power feed layer, to form the low resistance part 332. Thereafter, the resist is removed.

Figure 3H:
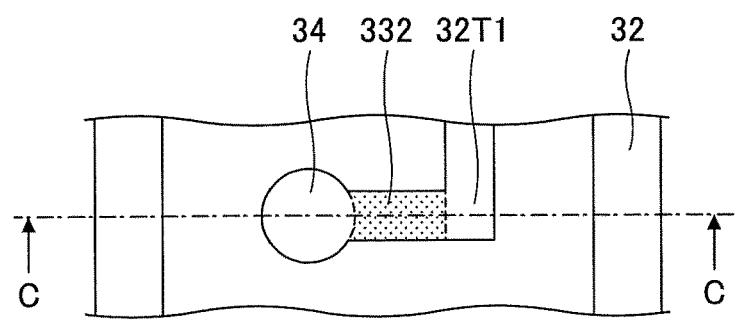

Next, in the process depicted in FIGS. 3G and 3H, the metal foil 321 is patterned to form the heating element 32, the wiring lines 33 in which the low resistance part 332 is joined onto the high resistance part 331, and the power feed terminals 34. Thus, the heating element 32, the wiring lines 33, and the power feed terminals 34 are formed in the same plane on the insulating resin film 311. In the zone Z4, one of the wiring lines 33 is formed to connect in series to the first end 32T1 of the heating element 32, and the other of the wiring lines 33 is formed to connect in series to the second end 32T2 of the heating element 32. FIG. 3H is a plan view of FIG. 3G. In other words, FIG. 3G is a cross-sectional view, taken along the line C-C of FIG. 3H. In FIG. 3H, the low resistance part 332 is indicated by a dot pattern for clarification.

Specifically, for example, a resist is formed on the entire surface of the metal foil 321, and is exposed to light and developed to form a resist pattern that covers only part of the metal foil 321 to be left as the heating element 32, the wiring lines 33, and the power feed terminals 34. Next, part of the metal foil 321 that is not covered with the resist pattern is removed by etching. As an etchant used to remove the metal foil 321, for example, a copper chloride etchant or a ferric chloride etchant may be used.

Thereafter, the resist pattern is stripped, using a stripping solution, to form the heating element 32, the wiring lines 33, and the power feed terminals 34 at respective predetermined positions on the insulating resin film 311 (photolithography). By forming the heating element 32 by photolithography, it is possible to reduce variations in the size of the heating element 32 in its width direction to improve the distribution of generated heat. The heating element 32 formed by etching may have, for example, a substantially trapezoidal cross-sectional shape. In this case, the difference in width between opposite surfaces of the heating element 32 of which one contacts the insulating resin film 311 may be, for example, approximately 10 μm to approximately 50 μm. By causing the heating element 32 to have a simple substantially trapezoidal cross-sectional shape, it is possible to improve the distribution of generated heat.

Figure 3I:
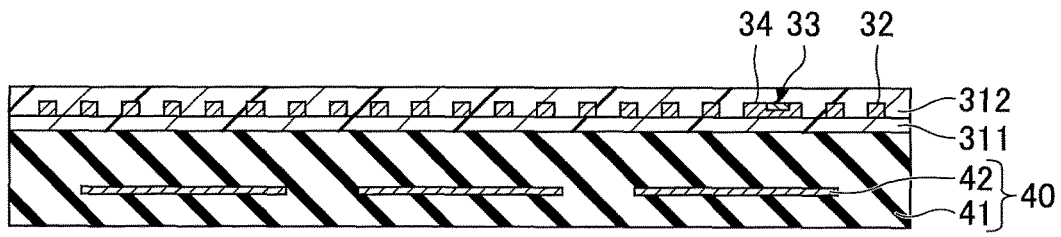

Next, in the process depicted in FIG. 3I, the insulating resin film 311 is laminated with an insulating resin film 312 that covers the heating element 32, the wiring lines 33, and the power feed terminals 34. Laminating the insulating resin film 311 with the insulating resin film 312 in a vacuum, which makes it possible to prevent inclusion of voids, is preferable. The material of the insulating resin film 312 may be the same as the material of the insulating resin film 311, for example. The thickness of the insulating resin film 312, however, may be suitably determined within the range where the insulating resin film 312 can cover the heating element 32, the wiring lines 33, and the power feed terminals 34, and does not necessarily have to be the same as the thickness of the insulating resin film 311.

Figure 3J:
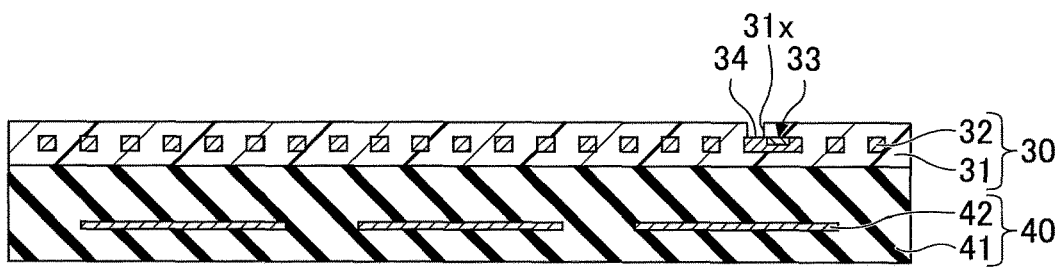

Next, in the process depicted in FIG. 3J, the insulating resin film 311 is exposed to light and developed to form the openings 31x each exposing part of one of the power feed terminals 34. Thereafter, the insulating resin films 311 and 312 are heated to or above a curing temperature to be cured while being pressed toward the electrostatic chuck 40. As a result, the insulating resin films 311 and 312 are combined together as one piece into the insulating layer 31. Consequently, the heating part 30 in which the heating element 32 is surrounded and covered by the insulating layer 31 is formed, and the insulating layer 31 of the heating part 30 and the electrostatic chuck 40 are directly bonded. It is preferable to heat the insulating resin films 311 and 312 at or below 200° C. in view of stress caused when the temperature returns to normal temperature.

By heating and curing the insulating resin films 311 and 312 while pressing the insulating resin films 311 and 312 against the electrostatic chuck 40, it is possible to flatten an upper surface (a surface opposite from a surface that contacts the electrostatic chuck 40) of the insulating layer 31 by reducing irregularities in the upper surface due to the presence or absence of the heating element 32. The size of irregularities in the upper surface of the insulating layer 31 is preferably 7 µm or less. By causing the size of irregularities in the upper surface of the insulating layer 31 to be 7 µm or less, it is possible to prevent air bubbles from being caught between the insulating layer 31 and the adhesive layer 20 (the second layer 22) in a subsequent process. That is, it is possible to prevent a decrease in the adhesion between the insulating layer 31 and the adhesive layer 20 (the second layer 22).

Figure 3K:
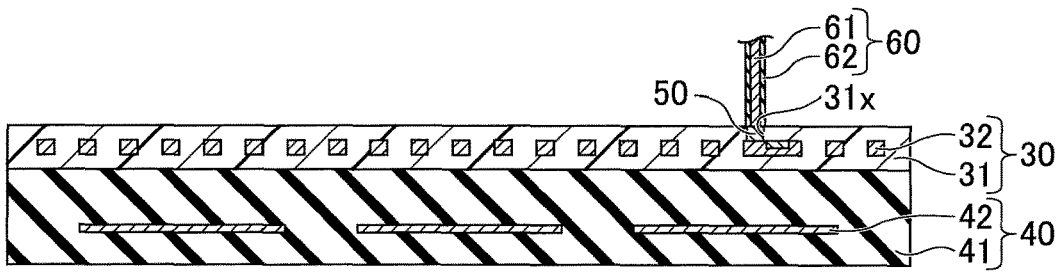

Next, in the process depicted in FIG. 3K, one end of the conductor 61 (such as a copper wire) of each power feed line 60 is connected through the joining part 50 (such as solder) to one of the power feed terminals 34 exposed in the corresponding opening 31x.

Figure 3L:
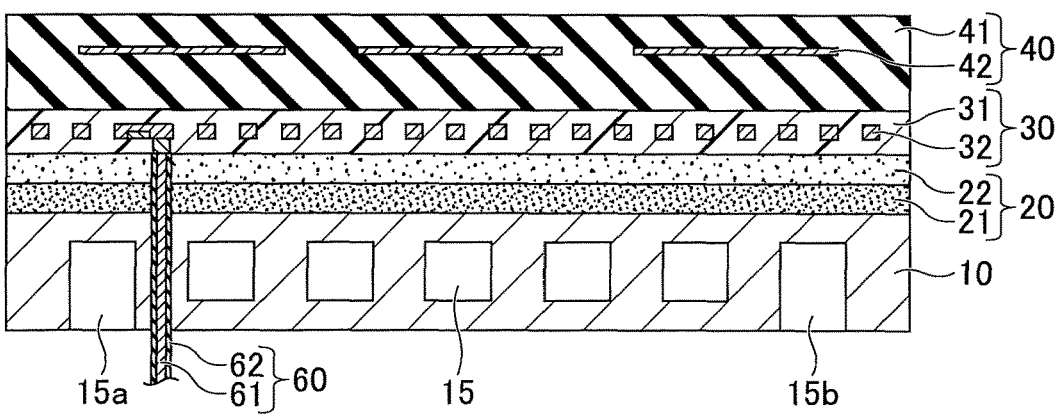

Next, in the process depicted in FIG. 3L, the baseplate 10 in which the water conduit 15, etc., are preformed is prepared, and the first layer 21 and the second layer 22 are successively stacked in this order on the baseplate 10 to form the adhesive layer 20 (uncured). Then, the structure depicted in FIG. 3K is inverted to be placed on the baseplate 10 through the adhesive layer 20, and the adhesive layer 20 is cured. Each power feed line 60 is inserted in advance through one of through holes preformed in the baseplate 10 to have the other end of the conductor 60 exposed on the lower surface side of the baseplate 10 to be available for connection to a power supply disposed outside the substrate fixing device 1. As a result, the substrate fixing device 1 in which the heating part 30 and the electrostatic chuck 40 are successively stacked in this order on the baseplate 10 through the adhesive layer 20 is completed.

Thus, according to the substrate fixing device 1 of the first embodiment, the wiring lines 33 connected in series to the heating element 32 are so structured as to have the low resistance part 332 joined onto the high resistance part 331. As a result, it is possible to reduce the resistance value of the wiring lines 33 to significantly reduce the heat generation of the wiring lines 33 compared with the heat generation of the heating element 32. For example, even in the case where the heating element 32 is independently provided in each of multiple zones and the wiring lines 33 are disposed across zones, it is possible to prevent impairment of the heating uniformity of each zone because heat generation by the wiring lines 33 is limited. That is, it is possible to achieve the substrate fixing device 1 in which the uniformity of heat generated by the heating element 32 is improved.

Routing the wiring lines 33 through the electrostatic chuck 40 or through another insulating layer added separately from the insulating layer 31, which is also possible, would result in a complicated structure or degrade the connection reliability of wiring lines. In contrast, according to this embodiment, the heating element 32 and the wiring lines 33 are buried in the insulating layer 31, that is, formed in the same layer, to prevent a structure from becoming complicated and prevent the connection reliability of wiring lines from being degraded.

[Variation of First Embodiment]

Next, a variation of the first embodiment is described. According to the variation of the first embodiment, wiring lines and power feed terminals are formed by a method different from that of the first embodiment. In the following description of the variation of the first embodiment, a description of the same elements or components as those of the above-described embodiment may be omitted.

FIGS. 4A through 4D are diagrams illustrating a process of manufacturing a substrate fixing device according to the variation of the first embodiment. First, in the process depicted in FIG. 4A, after execution of the same processes as depicted in FIGS. 3A through 3C of the first embodiment, the metal foil 321 is patterned to form the heating element 32, wiring lines 330 connected in series to the heating element 32, and the power feed terminals 34. The wiring lines 330, which are wiring lines before formation of the low resistance part 332, are entirely formed of a high resistance part.

Figure 4A:
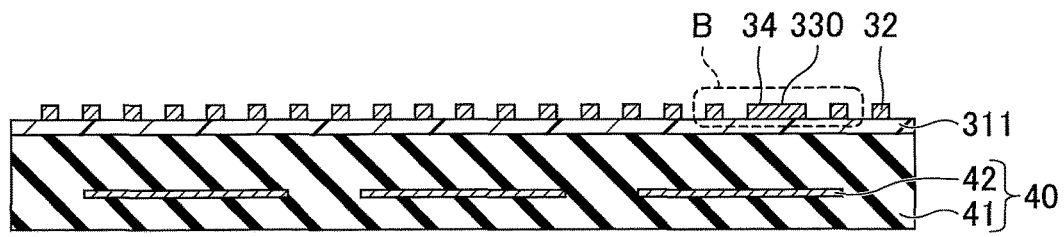
FIGS. 4A through 4D are diagrams illustrating a process of manufacturing a substrate fixing device according to a variation of the first embodiment.
Figure 4B:
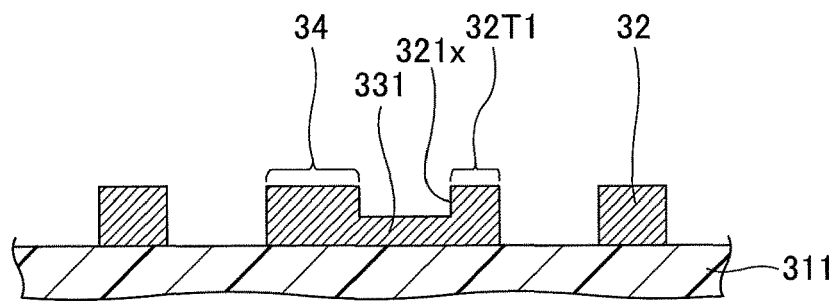
Figure 4C:
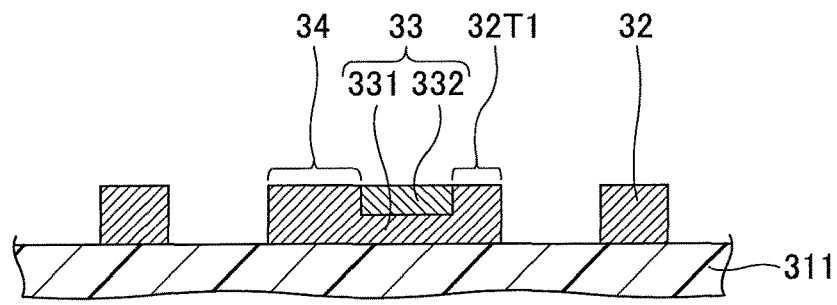

Next, in the process depicted in FIG. 4B, each wiring line 330 is half-etched to form the recess 321x where the low resistance part 332 is desired to be formed. That is, the wiring lines 330 are half-etched to form the high resistance part 331 that is smaller in layer thickness than the heating element 32. A specific method of forming the recess 321x is as described above with reference to FIGS. 3D and 3E. FIGS. 4B and 4C are enlarged views of part B of FIG. 4A.

Figure 4D:
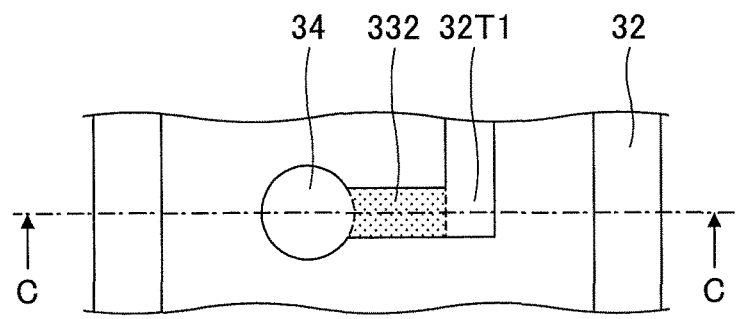

Next, in the process depicted in FIGS. 4C and 4D, the low resistance part 332 is formed in the recess 321x in the same manner as in the process depicted in FIG. 3F. As a result, the wiring lines 33 in which the low resistance part 332 is joined onto the high resistance part 331 are completed. FIG. 4D is a plan view of FIG. 4C. In other words, FIG. 4C is a cross-sectional view, taken along the line C-C of FIG. 4D. In FIG. 4D, the low resistance part 332 is indicated by a dot pattern for clarification.

Thereafter, the same processes as depicted in FIGS. 3I through 3L of the first embodiment are executed to complete the substrate fixing device 1 in which the heating part 30 and the electrostatic chuck 40 are successively stacked in this order on the baseplate 10 through the adhesive layer 20.

Thus, the low resistance part 332 may be formed after patterning the metal foil 321.

Second Embodiment

Next, a second embodiment is described. The second embodiment is different from the first embodiment in the structure of wiring lines. In the following description of the second embodiment, a description of the same elements or components as those of the above-described embodiment may be omitted.

Figure 5A:
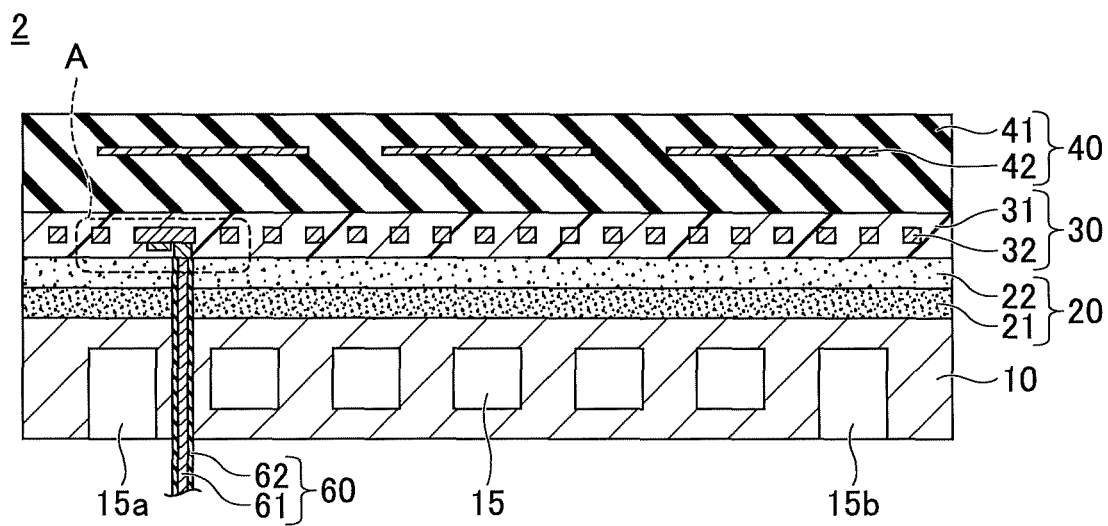
FIGS. 5A and 5B are schematic cross-sectional views of a substrate fixing device according to a second embodiment.
Figure 5B:
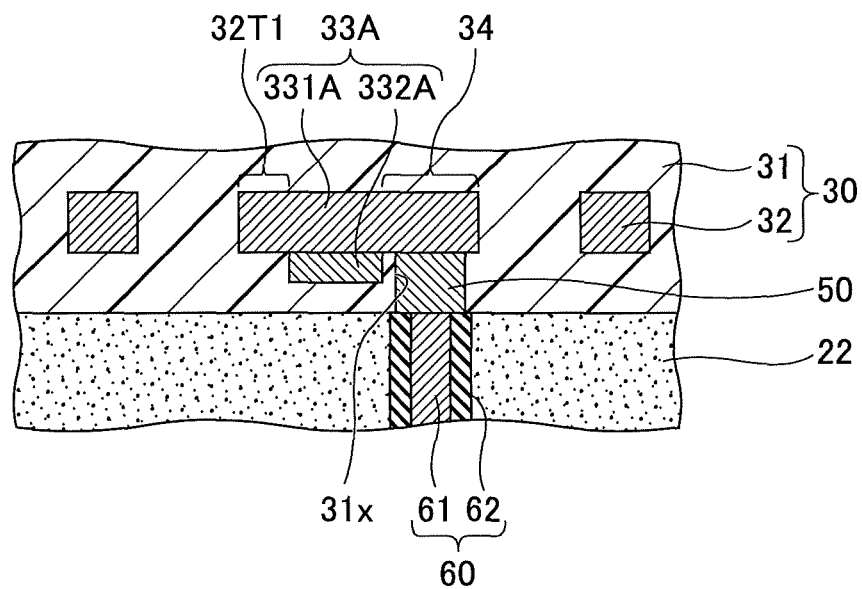
Figure 6A:
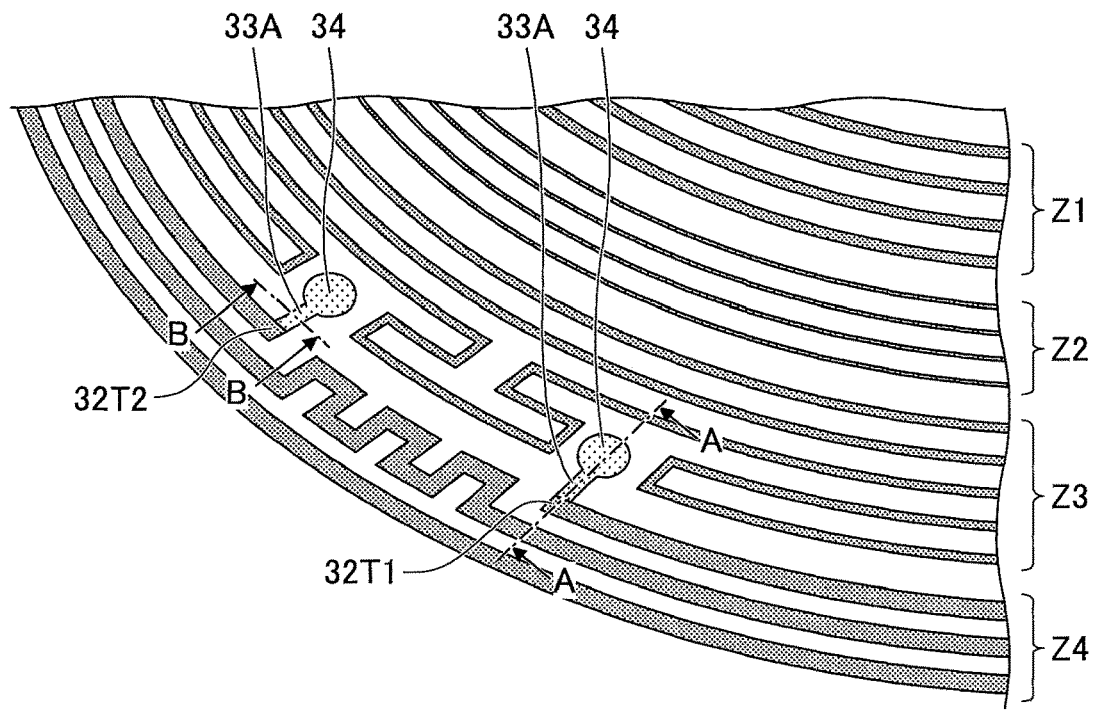
FIGS. 6A through 6C are diagrams illustrating a heating element of the substrate fixing device according to the second embodiment.
Figure 6B:
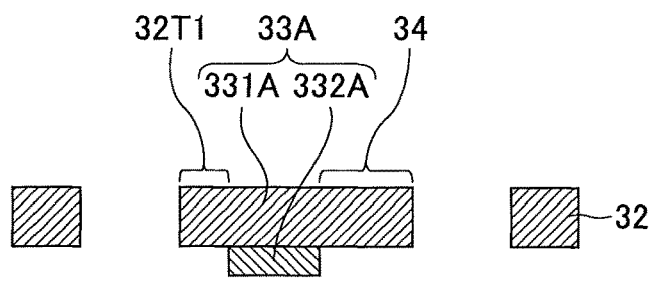
Figure 6C:
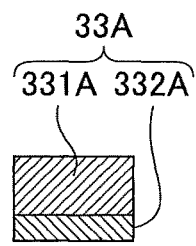

FIG. 5A is a schematic cross-sectional view of a substrate fixing device in its entirety according to the second embodiment. FIG. 5B is a schematic enlarged view of part A of FIG. 5A. FIGS. 6A through 6C are diagrams illustrating a heating element of the substrate fixing device according to the second embodiment. FIG. 6A is a partial plan view, FIG. 6B is a cross-sectional view, taken along the line A-A of FIG. 6A, and FIG. 6C is a cross-sectional view, taken along the line B-B of FIG. 6A.

Referring to FIGS. 5A through 6C, a substrate fixing device 2 according to the second embodiment is different from the substrate fixing device 1 of the first embodiment in that the wiring lines 33 are replaced with wiring lines 33A. The wiring lines 33A include a high resistance part 331A and a low resistance part 332A. Like the high resistance part 331, the high resistance part 331A is formed of the same material as the heating element 32. Like the low resistance part 332, the low resistance part 332A is formed of a material lower in resistivity than the heating element 32. However, no recess is formed in the high resistance part 331A, and the high resistance part 331A has the same layer thickness as the heating element 32. Furthermore, the low resistance part 332A is formed to project from a surface of the high resistance part 331A. That is, the wiring lines 33A are greater in layer thickness than the heating element 32.

FIGS. 7A through 7D are diagrams illustrating a process of manufacturing a substrate fixing device according to the second embodiment. First, the same processes as depicted in FIGS. 3A through 3C of the first embodiment are executed to form a structure depicted in FIG. 7A.

Figure 7A:
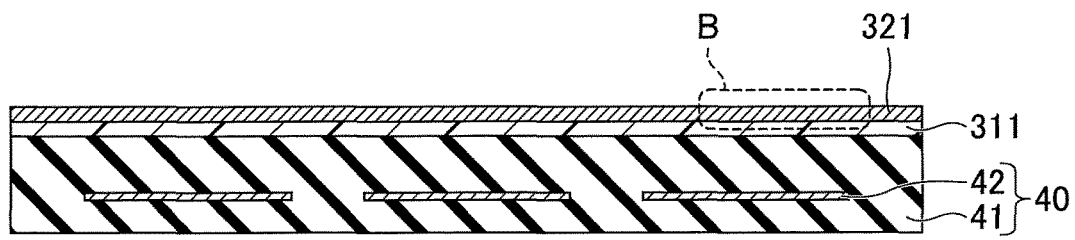
FIGS. 7A through 7D are diagrams illustrating a process of manufacturing a substrate fixing device according to the second embodiment.
Figure 7B:
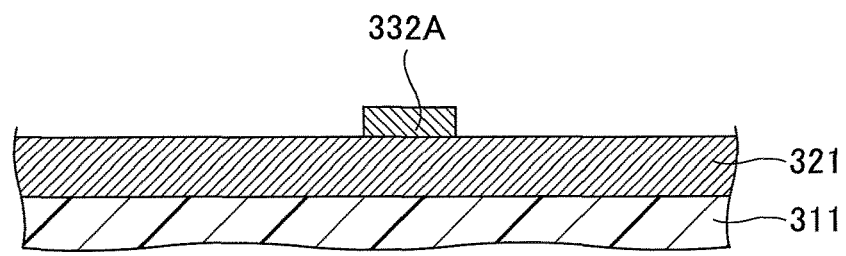
Figure 7C:
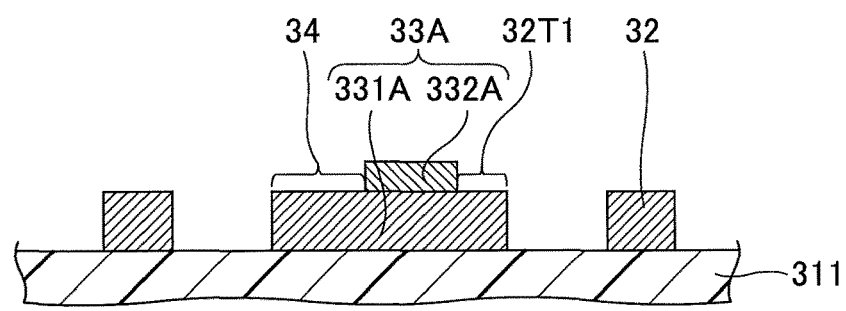

Next, in the process depicted in FIG. 7B, the low resistance part 332A is formed in a predetermined region on the metal foil 321. Specifically, for example, a resist is formed on the entire surface of the metal foil 321, and is exposed to light and developed to form a resist pattern that exposes only a part of the metal foil 321 where the low resistance part 332A is to be formed. Next, copper is deposited on the metal foil 321 exposed through the resist pattern by, for example, electroplating, using the metal foil 321 as a power feed layer, to form the low resistance part 332A. Thereafter, the resist is removed. FIGS. 7B and 7C are enlarged view of part B of FIG. 7A.

Figure 7D:
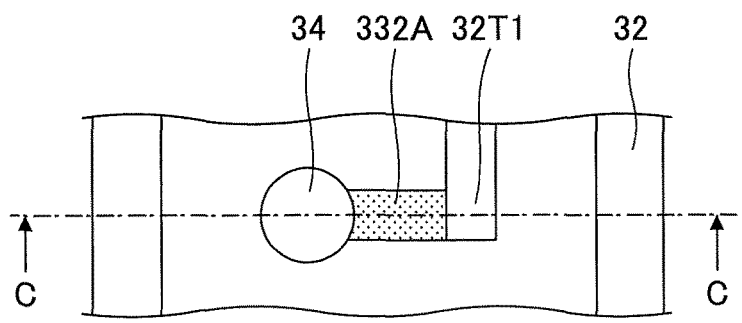

Next, in the process depicted in FIGS. 7C and 7D, the metal foil 321 is patterned in the same manner as in the process depicted in FIGS. 3G and 3H to form the heating element 32, the wiring lines 33A in which the low resistance part 332A is joined onto the high resistance part 331A, and the power feed terminals 34. FIG. 7D is a plan view of FIG. 7C. In other words, FIG. 7C is a cross-sectional view, taken along the line C-C of FIG. 7D. In FIG. 7D, the low resistance part 332A is indicated by a dot pattern for clarification.

Thereafter, the same processes as depicted in FIGS. 3I through 3L of the first embodiment are executed to complete the substrate fixing device 2 in which the heating part 30 and the electrostatic chuck 40 are successively stacked in this order on the baseplate 10 through the adhesive layer 20.

Thus, the wiring lines 33A in which the low resistance part 332A is joined onto the high resistance part 331A may be formed without half-etching the metal foil 321. That is, the layer thickness of the high resistance part may be equal to or smaller than the layer thickness of the heating element.

[Variation of Second Embodiment]

Next, a variation of the second embodiment is described. According to the variation of the second embodiment, wiring lines and power feed terminals are formed by a method different from that of the second embodiment. In the following description of the variation of the second embodiment, a description of the same elements or components as those of the above-described embodiment may be omitted.

FIGS. 8A through 8D are diagrams illustrating a process of manufacturing a substrate fixing device according to the variation of the second embodiment. First, in the process depicted in FIG. 8A, after execution of the same processes as depicted in FIGS. 3A through 3C of the first embodiment, the metal foil 321 is patterned to form the heating element 32, the high resistance part 331A, and the power feed terminals 34.

Figure 8A:
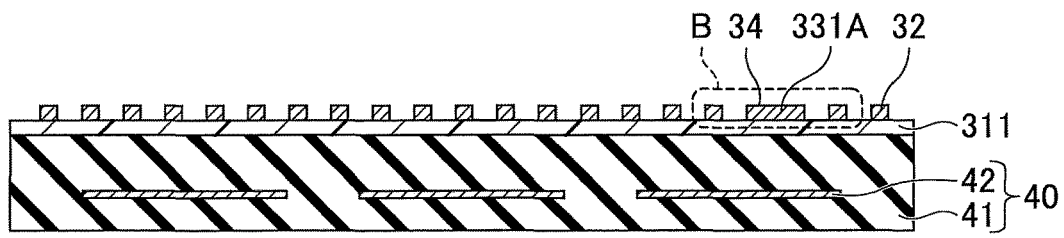
FIGS. 8A through 8D are diagrams illustrating a process of manufacturing a substrate fixing device according to a variation of the second embodiment.
Figure 8B:
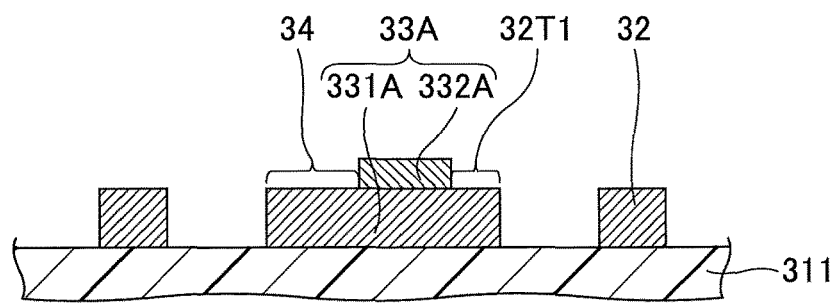
Figure 8C:
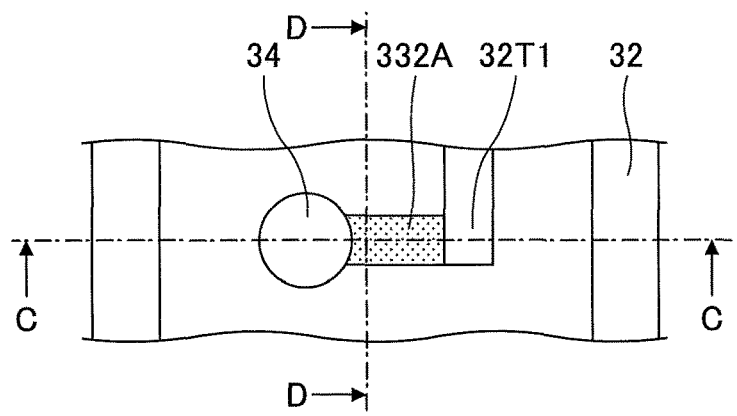
Figure 8D:
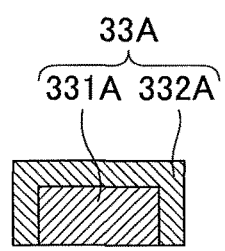

Next, in the process depicted in FIGS. 8B through 8D, the low resistance part 332A is formed on the high resistance part 331A in the same manner as in the process depicted in FIG. 7B. FIG. 8B is an enlarged view of part B of FIG. 8A. FIG. 8C is a plan view of FIG. 8B. In other words, FIG. 8B is a cross-sectional view, taken along the line C-C of FIG. 8C. In FIG. 8C, the low resistance part 332A is indicated by a dot pattern for clarification. FIG. 8D is a cross-sectional view, taken along the line D-D of FIG. 8C.

Thereafter, the same processes as depicted in FIGS. 3I through 3L of the first embodiment are executed to complete the substrate fixing device 2 in which the heating part 30 and the electrostatic chuck 40 are successively stacked in this order on the baseplate 10 through the adhesive layer 20.

Thus, the low resistance part 332A may be formed after patterning the metal foil 321. According to the manufacturing process of the variation of the second embodiment, as depicted in FIG. 8D, the low resistance part 332A is also formed on longitudinal side surfaces of the high resistance part 331A.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, according to the above-described embodiment, a heating element is independently disposed in each of multiple zones. Embodiments of the present invention, however, is also applicable when it is desired to reduce the resistance of part of a heating element in a substrate fixing device (not divided into multiple zones) having a single continuous heating element.

Examples of objects to be attracted and held by a substrate fixing device according to embodiments of the present invention include, in addition to semiconductor wafers (such as silicon wafers), glass substrates used in the process of manufacturing, for example, liquid crystal panels.

Various aspects of the subject-matter described herein may be set out non-exhaustively in the following numbered clauses:

1. A method of manufacturing a substrate fixing device including a baseplate and an electrostatic chuck, the method including:

forming an insulating layer on the electrostatic chuck, the insulating layer including a heating element formed of a first material and a wiring line connected in series to the heating element; and adhering a laminate of the electrostatic chuck and the insulating layer onto the baseplate, wherein forming the insulating layer includes placing a first insulating resin film on the electrostatic chuck;

placing metal foil formed of the first material on the first insulating resin film;

depositing a second material having a resistivity lower than a resistivity of the first material on the metal foil;

patterning the metal foil to form the heating element formed of the first material, and the wiring line, the wiring line including a first conductive layer formed of the first material and a second conductive layer formed of the second material and joined onto the first conductive layer;

placing a second insulating resin film that covers the heating element and the wiring line on the first insulating resin film; and curing the first insulating resin film and the second insulating resin film to form the insulating layer bonded to the electrostatic chuck.

2. The method of clause 1, wherein the first conductive layer is formed by half-etching to have a layer thickness smaller than a layer thickness of the heating element, and the second conductive layer is famed on the first conductive layer having the layer thickness smaller than the layer thickness of the heating element.

3. A method of manufacturing a substrate fixing device including a baseplate and an electrostatic chuck, the method including:

forming an insulating layer on the electrostatic chuck, the insulating layer including a heating element famed of a first material and a wiring line connected in series to the heating element; and adhering a laminate of the electrostatic chuck and the insulating layer onto the baseplate, wherein forming the insulating layer includes placing a first insulating resin film on the electrostatic chuck;

placing metal foil formed of the first material on the first insulating resin film;

patterning the metal foil to form the heating element and a first conductive layer connected in series to the heating element;

forming a second conductive layer on the first conductive layer to form the wiring line, the second conductive layer being formed of a second material having a resistivity lower than a resistivity of the first material;

placing a second insulating resin film that covers the heating element and the wiring line on the first insulating resin film; and curing the first insulating resin film and the second insulating resin film to form the insulating layer bonded to the electrostatic chuck.

4. The method of clause 3, wherein the first conductive layer is formed by half-etching to have a layer thickness smaller than a layer thickness of the heating element, and the second conductive layer is formed on the first conductive layer having the layer thickness smaller than the layer thickness of the heating element.

What is claimed is:

1. A substrate fixing device, comprising:
   a baseplate;
   an electrostatic chuck; and
   an insulating layer interposed between the baseplate and the electrostatic chuck,
   the insulating layer including
      a heating element formed of a first material; and
      a wiring line connected in series to the heating element, the wiring line including
         a first conductive layer formed of the first material; and
         a second conductive layer joined onto the first conductive layer, the second conductive layer being formed of a second material having a resistivity lower than a resistivity of the first material,
   wherein a layer thickness of the first conductive layer is smaller than or equal to a layer thickness of the heating element.

2. The substrate fixing device as claimed in claim 1, further comprising:
   a power feed terminal configured to supply voltage to the heating element, the power feed terminal being connected to the heating element through the wiring line.

3. The substrate fixing device as claimed in claim 2, wherein
   the heating element is independently disposed in each of a plurality of zones including a first zone and a second zone,
   the wiring line is disposed across the first zone and the second zone,
   the power feed terminal is disposed in the second zone, and
   the heating element disposed in the first zone is connected to the power feed terminal through the wiring line.

4. The substrate fixing device as claimed in claim 1, wherein the insulating layer and the electrostatic chuck are directly bonded.

5. The substrate fixing device as claimed in claim 1, wherein the heating element includes at least one roughened surface.

6. The substrate fixing device as claimed in claim 1, wherein a surface of the heating element facing toward the electrostatic chuck and a surface of the wiring line facing toward the electrostatic chuck are in a same plane.

7. The substrate fixing device as claimed in claim 1, wherein
   the first conductive layer is a rolled alloy, and
   the second conductive layer is a metal plating on the rolled alloy.

* * * * *